(12) United States Patent
Nakagawara et al.

(10) Patent No.: US 7,146,695 B2
(45) Date of Patent: Dec. 12, 2006

(54) METHOD FOR MANUFACTURING A SURFACE ACOUSTIC WAVE DEVICE WITH A PIEZOELECTRIC SUBSTRATE

(75) Inventors: Osamu Nakagawara, Ritto (JP); Masahiko Saeki, Shiga-ken (JP); Kazuhiro Inoue, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/953,348

(22) Filed: Sep. 30, 2004

(65) Prior Publication Data
US 2005/0057121 A1    Mar. 17, 2005

Related U.S. Application Data

(62) Division of application No. 10/329,338, filed on Dec. 27, 2002, now Pat. No. 6,822,371.

(30) Foreign Application Priority Data

| Dec. 27, 2001 | (JP) | ............................. 2001-397850 |
| Dec. 27, 2001 | (JP) | ............................. 2001-397851 |
| Nov. 26, 2002 | (JP) | ............................. 2002-341690 |
| Nov. 26, 2002 | (JP) | ............................. 2002-341691 |

(51) Int. Cl.
*H04R 17/00* (2006.01)

(52) U.S. Cl. .................. 29/25.35; 29/830; 29/831; 29/832; 29/835; 29/846

(58) Field of Classification Search ............... 29/25.35, 29/830, 831, 832, 835, 846; 310/313 R, 310/363–366, 313 A
See application file for complete search history.

(56) References Cited

U.S. PATENT DOCUMENTS

| 4,427,515 | A |   | 1/1984  | Yuhara et al. |                |
| 4,634,913 | A | * | 1/1987  | Whatmore et al. | ..... 310/313 A |
| 5,061,870 | A | * | 10/1991 | Ieki et al. | ............... 310/313 A |
| 5,162,690 | A | * | 11/1992 | Ieki et al. | ............... 310/313 R |

(Continued)

FOREIGN PATENT DOCUMENTS

EP          0 407 163 B1       1/1991

(Continued)

OTHER PUBLICATIONS

"Technical Handbook of Surface Acoustic Wave Device" edited by the 150th Committee on Technology of Surface Acoustic Wave Device of Japan Society for the Promotion of Science, published by Ohmsha, Ltd., p. 267-268.

(Continued)

*Primary Examiner*—A. Dexter Tugbang
*Assistant Examiner*—Tai Van Nguyen
(74) *Attorney, Agent, or Firm*—Keating & Bennett, LLP (57) ABSTRACT

A surface acoustic wave device has superior electrical power resistance that is obtained by improving stress migration resistance of electrodes. In order to form at least one electrode, for example, on a $\theta$ rotation Y-cut ($\theta=36°$ to $42°$) $LiTaO_3$ piezoelectric substrate, an underlying electrode layer including Ti or Cr as a primary component is formed, and an Al electrode layer including Al as a primary component is then formed on this underlying electrode layer. The Al electrode layer is an oriented film grown by epitaxial growth and is also a polycrystalline thin film having a twin structure in which a diffraction pattern observed in an X-ray diffraction pole figure has a plurality of symmetry centers.

15 Claims, 8 Drawing Sheets

1

U.S. PATENT DOCUMENTS

| | | | | |
|---|---|---|---|---|
| 5,446,330 | A | * | 8/1995 | Eda et al. ............... 310/313 R |
| 5,650,362 | A | * | 7/1997 | Nashimoto ............... 427/126.3 |
| 5,773,917 | A | * | 6/1998 | Satoh et al. ............... 310/364 |
| 5,774,962 | A | * | 7/1998 | Satoh et al. ............... 29/25.35 |
| 6,316,860 | B1 | * | 11/2001 | Kimura et al. ........... 310/313 A |
| 6,339,277 | B1 | | 1/2002 | Iwamoto et al. |
| 6,630,767 | B1 | | 10/2003 | Inoue et al. |

FOREIGN PATENT DOCUMENTS

| | | |
|---|---|---|
| EP | 0 940 914 A1 | 9/1999 |
| EP | 1 041 716 A1 | 10/2000 |
| JP | 3-040510 | 2/1991 |
| JP | 03-048511 | 3/1991 |
| JP | 06-006173 | 1/1994 |
| JP | 07-162255 | 6/1995 |
| JP | 08-195635 A1 | 7/1996 |
| JP | 9-018270 | 1/1997 |
| JP | 2665597 B2 | 6/1997 |
| JP | 2000-145949 A | 5/2000 |
| JP | 2000-240786 A | 9/2000 |
| JP | 3183235 B2 | 4/2001 |
| JP | 3230465 B2 | 9/2001 |
| JP | 3240979 B2 | 10/2001 |
| TW | 310502 | 6/1996 |
| WO | 99/16168 A1 | 4/1999 |
| WO | 00/24123 A1 | 4/2000 |
| WO | 00/74235 A1 | 12/2000 |

OTHER PUBLICATIONS

N. Thangaraj et al., "Epitaxial Growth of (001) Al on (111) Si by Vapor Deposition", Applied Physics Letters 61, Aug. 1992, No. 8, New York, U.S., pp. 913-915.

Official Communication issued in the corresponding Japanese Application No. 2002-341690, mailed on Jul. 25, 2006.

* cited by examiner

METHOD FOR MANUFACTURING A SURFACE ACOUSTIC WAVE DEVICE WITH A PIEZOELECTRIC SUBSTRATE

This application is a Divisional of U.S. patent application Ser. No. 10/329,338 filed Dec. 27, 2002, now U.S. Pat. No. 6,822,371.

BACKGROUND OF THE INVENTION

1. Field of the Invention

The present invention relates to surface acoustic wave devices, such as surface acoustic wave resonators or surface acoustic wave filters, and manufacturing methods therefor, and more particularly, relates to an electrode structure of a surface acoustic wave device and a forming method therefor.

2. Description of the Related Art

As has been well known, surface acoustic wave devices are electronic elements including a surface acoustic wave in which mechanical vibration energy is concentrated only in the vicinity of surfaces of a solid material and is then propagated. In addition, the surface acoustic wave devices are each generally composed of a piezoelectric substrate having piezoelectric properties and electrodes, such as interdigital electrodes and/or grating electrodes, disposed on the piezoelectric substrate for processing electrical signals and surface acoustic waves.

In the surface acoustic wave devices described above, as an electrode material, aluminum (Al) having a low electrical resistivity and a low specific gravity or an alloy thereof has been used.

However, since Al has poor stress migration resistance, when a large electrical power is applied thereto, hillocks and/or voids are formed in the electrodes, and short-circuiting or disconnection of the electrodes may occur in some cases, resulting in breakage of the surface acoustic wave device.

In order to solve the problems described above, a method for improving electrical power resistance has been disclosed in Japanese Unexamined Patent Application Publication No. 7-162255 (patent publication 1) in which the crystal orientation is improved by an ion beam sputtering method used as a method for forming electrodes.

In addition, another method for improving electrical power resistance has been proposed in Japanese Unexamined Patent Application Publication No. 3-48511 (patent publication 2) in which an Al crystal is oriented in a predetermined direction by an epitaxial growth method.

Japanese Unexamined Patent Application Publication No. 6-6173 (patent publication 3) has disclosed that electrical power resistance of electrodes can be improved as crystal grain size is decreased.

Furthermore, in "Technical Handbook of Surface Acoustic Wave Device" edited by the 150th Committee on Technology of Surface Acoustic Wave Device of Japan Society for the Promotion of Science, published by Ohmsha, Ltd., p. 267 (non-patent publication 1), a phenomenon has been disclosed in which the electrical power resistance is improved when copper (Cu) is added to Al.

Patent publication 1: Japanese Unexamined Patent Application Publication No. 7-162255
Patent publication 2: Japanese Unexamined Patent Application Publication No. 3-48511
Patent publication 3: Japanese Unexamined Patent Application Publication No. 6-6173
Non-patent publication 1: "Technical Handbook of Surface Acoustic Wave Device" edited by the 150th Committee on Technology of Surface Acoustic Wave Device of Japan Society for the Promotion of Science, published by Ohmsha, Ltd., p. 267.

However, by the traditional techniques disclosed in patent publications 1 and 3, recent higher frequency and larger electrical power requirements cannot satisfactorily be fulfilled, and hence, when the techniques described above are used in high-frequency or large electrical power applications, insufficient electrical power resistance becomes a serious problem.

In addition, according to the traditional technique disclosed in patent publication 2, an epitaxial film having superior crystallinity can be actually grown only on a quartz substrate. However, on a substrate composed of a piezoelectric crystal, such as $LiTaO_3$ or $LiNbO_3$, used for filters which have superior piezoelectric properties and are advantageously used in a broad band, it has been difficult to grow an epitaxial film having superior crystallinity by the technique disclosed in patent publication 2, and as a result, the traditional technique described above cannot practically be applied to a surface acoustic wave device including a $LiTaO_3$ or $LiNbO_3$ substrate.

According to the traditional technique disclosed in non-patent publication 1, by adding Cu to Al, the electrical power resistance can actually be improved. However, a level of this improvement has not been satisfactory in practice.

SUMMARY OF THE INVENTION

In order to overcome the problems described above, preferred embodiments of the present invention provide a surface acoustic wave device and a manufacturing method therefore, in which the novel surface acoustic wave device achieves superior electrical power resistance by using an epitaxial Al film having a twin structure for an Al electrode layer which is primarily composed of Al and which constitutes an electrode provided on a piezoelectric substrate formed, for example, of a 64° Y-X cut $LiNbO_3$. In this case, it was understood that the epitaxial Al film grows in a particular manner, that is, the (111) plane thereof is oriented with respect to a Z axis of the piezoelectric substrate and has a twin structure which is grown in the (111) plane.

Compared to a single crystal, mechanical strength of an epitaxial film having a twin structure is very high, and as a result, the plastic deformation is unlikely to occur. Accordingly, a significant advantage can be obtained in that electrode breakage of surface acoustic wave devices, which is frequently caused by stress migration, is prevented from occurring.

Through intensive research by the inventors of the present invention regarding the epitaxial Al film having the twin structure described above, it was understood that, in some cases, crystal growth may occur according to a mechanism which is totally different from that in which the epitaxial film grows while the (111) plane of the Al film is oriented with respect to the Z axis as described above. In this case, the Al(111) plane is not oriented along the Z axis of the piezoelectric substrate, and very particular crystal growth occurs in which the Al(111) are oriented in a plurality of directions. The crystal growth described above is observed in particular when a Y-cut piezoelectric single crystal is used as a piezoelectric substrate, and in more particular, when 36° to 42° Y-cut $LiTaO_3$ substrate is used. Other suitable substrates may also be used.

According to the information thus obtained, a preferred embodiment of the present invention provides a surface acoustic wave device including a piezoelectric substrate made of a piezoelectric single crystal and at least one electrode provided on the piezoelectric substrate, and the at least one electrode has an electrode layer which is an oriented electrode layer formed by epitaxial growth, and the electrode layer is a polycrystalline thin film having a twin structure in which a diffraction pattern observed in an X-ray diffraction pole figure has a plurality of symmetry centers.

The electrode layer described above preferably includes Al as a primary component.

The electrode described above may further include an underlying electrode layer provided between the electrode layer and the piezoelectric substrate for improving the crystallinity of the electrode layer. This underlying electrode layer may include at least one of titanium (Ti) and chromium (Cr) as a primary component.

In addition, the electrode may further include an intermediate electrode layer provided between the Al electrode layer and the underlying electrode layer so as to cause a crystal face present the surface of the underlying layer to be in a cleaner state.

The piezoelectric substrate preferably includes a $LiNbO_3$ or a $LiTaO_3$ single crystal and, more preferably, is a $\theta$ rotation Y-cut ($\theta$ is between 36° and 42°) $LiTaO_3$ substrate.

Concerning the crystal orientation of the electrode layer provided for the surface acoustic wave device of preferred embodiments of the present invention, in X-ray diffraction in which X-rays are incident on the (200) plane of the crystal constituting the electrode layer, the [111] direction of the crystal is preferably oriented so as to approximately coincide with the center of symmetry spots detected in the X-ray diffraction pole figure.

In addition, the symmetry spots in the X-ray diffraction pole figure preferably have at least two centers, the crystal of the electrode layer may grow in at least two [111] directions, and the [111] directions of the crystal may be oriented so as to approximately coincide with the centers of the symmetry spots detected in the X-ray diffraction pole figure.

In the case described above, the symmetry spots detected in the X-ray diffraction may form three-fold or six-fold symmetry.

According to another preferred embodiment of the present invention, a method for manufacturing a surface acoustic wave device including a piezoelectric substrate formed of a Y-cut piezoelectric single crystal, and at least one electrode formed on the piezoelectric substrate, the electrode including an Al electrode layer primarily composed of Al and an underlying electrode layer provided between the piezoelectric substrate and the Al electrode layer for improving the crystallinity thereof, the Al electrode layer being an oriented film formed by epitaxial growth and being a polycrystalline thin film having a twin structure in which a diffraction pattern observed in an X-ray diffraction pole figure has a plurality of symmetry centers, is provided.

The method for manufacturing the surface acoustic wave device of a preferred embodiment of the present invention includes preparing the piezoelectric substrate formed of the Y-cut piezoelectric single crystal, forming the underlying electrode layer on the piezoelectric substrate, forming the Al electrode layer on the underlying electrode layer, and performing etching treatment for the piezoelectric substrate prior to the step of forming the underlying electrode layer to expose a crystal face on a surface of the piezoelectric substrate so that the Al electrode layer can be formed by epitaxial growth.

The etching step described above is preferably performed using an etchant including at least one selected from the group consisting of phosphoric acid, pyrophosphoric acid, benzoic acid, octanoic acid, hydrochloric acid, nitric acid, sulfuric acid, hydrofluoric acid, buffered hydrofluoric acid (BHF), and potassium hydrogen sulfate.

In addition, through further detailed investigation regarding the epitaxial Al film having a twin structure, it was understood that crystal growth may occur in some cases according to a mechanism which is totally different from the mechanism described above in which the epitaxial growth proceeds while the (111) plane of the Al film is oriented with respect to the Z axis. The crystal growth described above is observed in particular when a low cut angle substrate, such as a 36° Y-cut piezoelectric single crystal, is used as a piezoelectric substrate, and is very particular crystal growth in which the Al(111) planes are oriented in at least two directions which are different from the Z axis of the piezoelectric substrate.

Depending on process conditions in which the underlying electrode layer and/or the Al electrode layer is formed, the crystal growth described above may not be performed in some cases. Through further detailed investigation on the phenomenon described above, it was understood that the Al electrode layer including an epitaxial Al film having a twin structure cannot be obtained unless the underlying electrode layer is formed using Ti by heating to a temperature of 70° C. or more, and the Al electrode layer is formed at a relatively low temperature of 50° C. or less. The reason for this is that when the Al electrode layer is formed by heating, due to the counter diffusion between Al and Ti, epitaxial growth of Al is inhibited.

A surface acoustic wave device produced by a method according to a preferred embodiment of the present invention includes a piezoelectric substrate, and at least one electrode formed on the piezoelectric substrate, the at least one electrode including an Al electrode layer primarily composed of Al and an underlying electrode layer provided between the piezoelectric substrate and the Al electrode layer for improving the crystallinity thereof. The method according to this preferred embodiment includes the following steps.

That is, the method includes a step of preparing the piezoelectric substrate, a step of forming the underlying electrode layer on the piezoelectric substrate by heating to a temperature of about 70° C. or more, and a subsequent step of forming the Al electrode layer at a relatively low temperature of about 50° C. or less.

The step of forming the underlying electrode layer by heating is preferably performed at a temperature of about 300° C. or less.

In addition, the step of forming the Al electrode layer at a relatively low temperature is preferably performed at a temperature of about 0° C. or more.

In preferred embodiments of the present invention, the piezoelectric substrate may include a Y-cut piezoelectric single crystal. In this case, the piezoelectric substrate is preferably a $LiNbO_3$ or a $LiTaO_3$ single crystal and is more preferably a $\theta$ rotation Y-cut ($\theta$=36° to 42°) $LiTaO_3$ substrate.

In the step of forming the Al electrode layer, the Al electrode layer is preferably grown so as to form an epitaxial film having a twin structure.

In addition, prior to the step of forming the underlying electrode layer, the present invention may further include a step of performing pretreatment for the piezoelectric substrate to expose a crystal face on a surface thereof so that the Al electrode layer can be formed by epitaxial growth. The underlying electrode layer preferably includes at least one of Ti and Cr as a primary component.

The present invention may further include a step of forming an intermediate electrode layer on the underlying electrode layer at a low temperature of about 50° C. or less for placing a crystal face present on the underlying electrode layer in a cleaner state, wherein the Al electrode layer is preferably formed on the intermediate electrode layer in the step of forming the Al electrode layer.

The intermediate electrode layer preferably includes at least one of Ti and Cr as a primary component or preferably includes the same material as that for the underlying electrode layer.

In addition, the step of forming the intermediate electrode layer at a low temperature is preferably performed at a temperature of about 0° C. or more.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
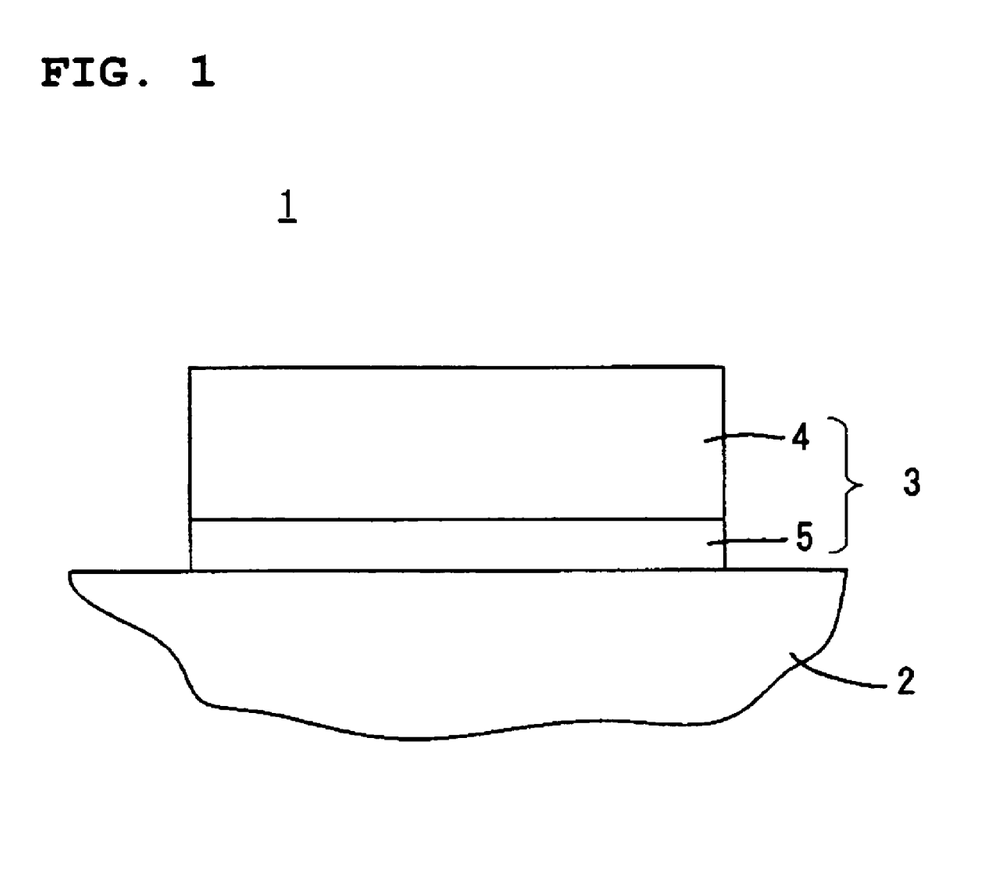
FIG. 1 is a partly cross-sectional view of a surface acoustic wave device of a preferred embodiment according to the present invention.

FIG. 1 is a partly cross-sectional view of a surface acoustic wave device I of a preferred embodiment according to the present invention, and in the figure, an electrode 3 disposed on a piezoelectric substrate 2 is shown.

The piezoelectric substrate 2 is preferably made of a piezoelectric single crystal, such as a Y-cut LiTaO$_3$ or LiNbO$_3$ single crystal. The piezoelectric substrate 2 is preferably composed of a θ rotation Y-cut(θ=36° to 42°) LiTaO$_3$ substrate.

The electrode 3 includes an Al electrode layer 4 preferably made of Al or an Al alloy primarily composed of Al. Between the Al electrode layer 4 and the piezoelectric substrate 2, an underlying electrode layer 5 is preferably provided for improving the crystallinity of the Al electrode layer 4. The underlying electrode layer 5 is primarily composed, for example, of at least one of Ti and Cr.

In order to manufacture the surface acoustic wave device 1, the following steps are performed, that is, the piezoelectric substrate 2 is prepared, the underlying electrode layer 5 is formed on the piezoelectric substrate 2, and subsequently, the Al electrode layer 4 is formed on the underlying electrode layer 5. Furthermore, the electrode 3 is formed into an interdigital shape by a photolithographic technique and a dry etching technique.

The Al electrode layer 4 is an oriented film formed by epitaxial growth and is a polycrystalline thin film having a twin structure in which a diffraction pattern observed in an X-ray diffraction pole figure has a plurality of symmetry centers.

In order to form the Al electrode layer 4 having the particular crystal structure described above, when the surface acoustic wave device 1 is manufactured, before the step of forming the underlying electrode layer 5 is performed, etching treatment is performed on the piezoelectric substrate 2 to expose a crystal face on the surface thereof so that the Al electrode layer 4 can be formed by epitaxial growth.

As an etchant used in the etching treatment described above, solvents containing phosphoric acid, pyrophosphoric acid, benzoic acid, octanoic acid, hydrochloric acid, nitric acid, sulfuric acid, hydrofluoric acid, buffered hydrofluoric acid (BHF), and potassium hydrogen sulfate may be preferably used alone or in combination.

According to the etching treatment described above, since a deteriorated layer having a thickness of several nanometers formed on the surface of the piezoelectric substrate 2 by machining, such as polishing, is removed, the crystal surface is exposed on the surface of the piezoelectric substrate 2, and hence information on crystal alignment, which is necessary for epitaxial growth, can be transmitted to the Al electrode layer 4.

In general, it has been believed that the presence of crystal grain boundaries of an Al electrode layer degrades the electrical power resistance of a surface acoustic wave device. The reason for this is that self-diffusion of Al occurs through the crystal grain boundaries by stress migration, resulting in the formation of defects such as so-called hillocks and/or voids. However, in the polycrystalline Al electrode layer 4 obtained according to preferred embodiments of the present invention, the thickness of the crystal grain boundary is one atomic distance or less, and hence the self-diffusion through this crystal grain boundary does not occur.

A polycrystalline metal has a mechanical strength that is higher than that of a single crystal metal. The reason for this is because of the plastic deformation mechanism of metals. That is, as the plastic deformation, shear deformation of a crystal occurs when an external force (vibration by the piezoelectric effect in the field of surface acoustic wave devices) is applied. Accordingly, the shear deformation in a single crystal occurs only by the activity of the most movable shear system therein, and on the other hand, the shear deformation in a poly crystal occurs as a result of the activities of a plurality of shear systems (see "Metal Handbook", fifth edition, Maruzen Co., Ltd., pp.337 to 343). Related to those described above, the resistance against plastic deformation relates to the resistance against electrode breakage caused by stress migration, and accordingly, an electrode structure having small grain diameters tends to have superior electrical power resistance.

As has been described, when the Al electrode layer 4 is an oriented film having the twin structure, the effect of preventing the formation of hillocks and/or voids, which are formed by the self-diffusion of electrode-forming atoms through the crystal grain boundaries, and superior electrical power resistance because of the resistance against the plastic deformation can be simultaneously obtained.

As described in non-patent publication 1, it has been well known that, by adding a different type of metal such as Cu to the Al electrode layer 4, the formation of hillocks and/or voids can be suppressed, and that the electrical power resistance can be improved. Accordingly, in the Al electrode layer 4, in addition to the use of an epitaxial Al film having the twin structure, when addition of Cu or the like is performed, the electrical power resistance can be further improved. As the additives having the effect of improving the electrical power resistance, in addition to Cu, for example, magnesium (Mg), nickel (Ni), and molybdenum (Mo) may be used. Hence, when the Al electrode layer 4 is formed of an Al alloy containing a small amount of at least one of these additives, the electrical power resistance can be further improved.

Although not shown in FIG. 1, a thin insulating film may be formed so as to cover the upper surface and the side surfaces of the electrode 3.

Hereinafter, particular examples of the surface acoustic wave device according to preferred embodiments of the present invention and the manufacturing method therefor will be described.

FIRST EXAMPLE

In order to form a surface acoustic wave device of a first example according to preferred embodiments of the present invention, a piezoelectric substrate 2 composed of a 36° Y-cut $LiTaO_3$ single crystal was first prepared, and then by performing pretreatment for this piezoelectric substrate 2 using a buffered hydrofluoric acid (BHF) solution at room temperature for 10 minutes, a deteriorated surface layer, which was present on the surface of the piezoelectric substrate 2 and inhibited epitaxial growth, was removed.

Next, by an electron beam deposition method, an underlying electrode layer 5 was formed at a deposition temperature of about 180° C. using Ti so as to have a thickness of about 20 nm and was then cooled to room temperature in an evacuated state.

After the cooling mentioned above, an Al electrode layer 4 was formed using Al so as to have a thickness of about 100 nm.

Figure 2:
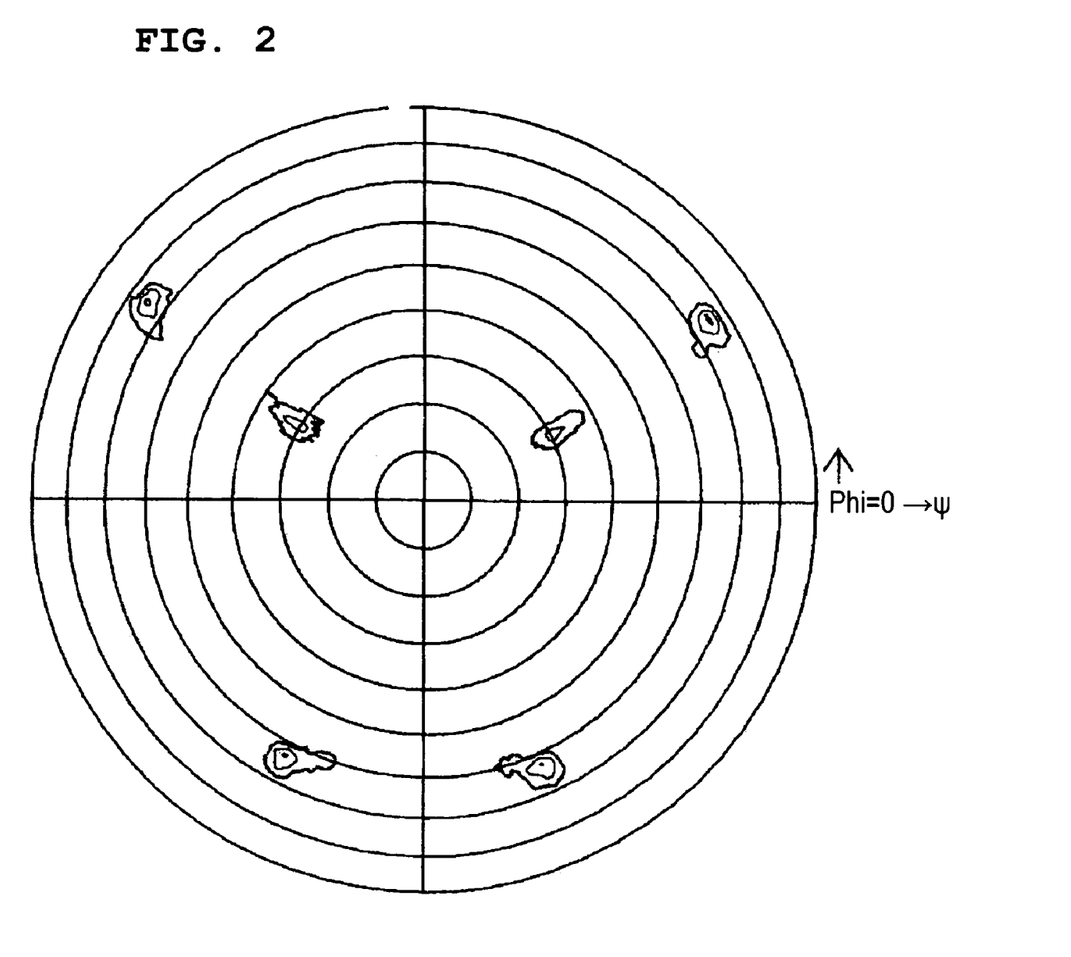
FIG. 2 is a view showing an X-ray diffraction pole figure of an Al electrode layer obtained in a first example according to a preferred embodiment the present invention.
Figure 3:
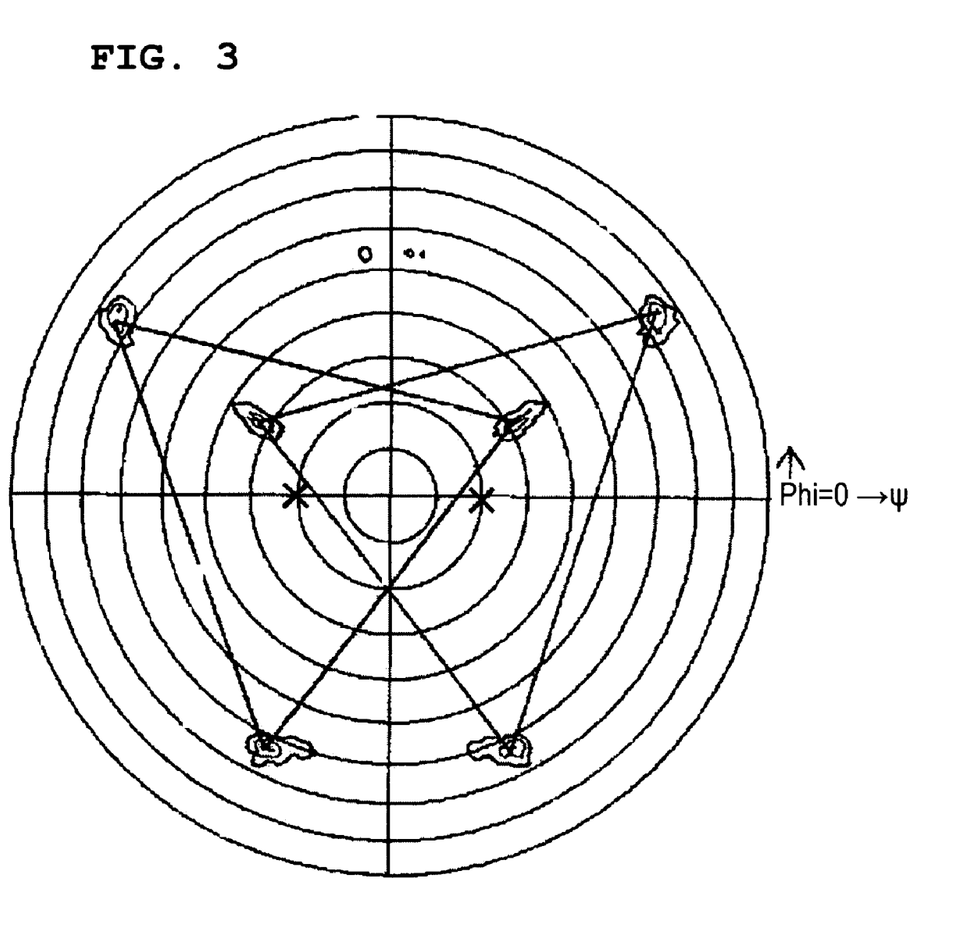
FIG. 3 is a view showing the X-ray diffraction pole shown in FIG. 2 provided with additional lines for illustrating the diffraction pattern.

X-ray diffraction analysis was performed for the Al electrode layer 4 thus formed. FIG. 2 shows an X-ray diffraction pole figure obtained by this analysis. This X-ray diffraction pole figure was obtained when X-rays were incident on the (200) plane of the Al electrode layer 4. As shown in FIG. 3, additional lines were drawn for illustrating the diffraction pattern shown in FIG. 2.

As shown in FIGS. 2 and 3, the Al electrode layer 4 was a thin epitaxial film in which diffraction spots having a plurality of symmetry spots were observed in the X-ray diffraction pole figure when X-rays were incident on the (200) plane of the Al. Six spots in FIGS. 2 and 3 show the detection of reflection signals from the (200) plane of the Al.

As can be seen from FIG. 3, the six diffraction spots thus detected were two sets of three-fold symmetry spots. The angular distance between each spot and the corresponding symmetry center in the $\psi$ direction was approximately 55°, and each symmetry center approximately coincided with the (111) direction of Al. In addition, the symmetry center and the normal line (the center of the pole figure) of the piezoelectric substrate 2 were spaced apart from each other by approximately ±10 to 20° in the $\psi$ direction. In FIG. 3, the distance between the symmetry center and the center of the pole figure was approximately 17° in the $\psi$ direction. However, since this angle varies in accordance with conditions of the piezoelectric substrate 2, a film-forming temperature, or the like, in consideration of this variation, the distance can be considered to be in the range of approximately ±10 to 20° as described above.

In the pole figure in the case of X-rays being incident on the (200) plane of the Al, the fact that the three-fold symmetry spots were observed means that the [111] direction of Al was oriented so as to approximately coincide with the center of the symmetry spots, that is, a triaxial orientation film was formed in which the Al[111] axis was grown in the direction toward the symmetry center.

In addition, the fact that the two sets of the three-fold symmetry spots were observed means that the two centers of the symmetry spots were present, and that the Al[111]-oriented crystal had two growing directions. In other words, the [111]-oriented single-crystal Al grew in two orientation directions, that is, the twin structure was formed.

As described above, it was confirmed that the film forming the Al electrode layer 4 is a triaxial-orientation epitaxial film formed of the Al(111) oriented in two growing directions and is also a polycrystalline film having the twin structure.

Next, the electrode 3 was formed into an interdigital shape using a photolithographic technique and a dry etching technique, thereby forming the surface acoustic wave filter defining the surface acoustic wave device 1.

As a comparative example for the first example described above, when a Ti film was formed without heating for forming the underlying electrode layer 5, an epitaxial film used as the Al electrode layer 4 could not be formed, and a uniaxial orientation film was formed in which the Al(111) plane grew perpendicular to the piezoelectric substrate 2.

When a constant electrical power was applied to each of the surface acoustic wave filters thus formed in order to compare the electrical power resistances therebetween, a service life (time until failure) of the filter formed in the first example was 1,000 times or more than that of the filter formed in the comparative example.

SECOND EXAMPLE

In a second example, a piezoelectric substrate 2 composed of a 42° Y-cut $LiTaO_3$ single crystal was prepared. Subsequently, in a process equivalent to that in the first example, the underlying electrode layer 5 was formed, and the Al electrode layer 4 was formed thereon.

Figure 4:
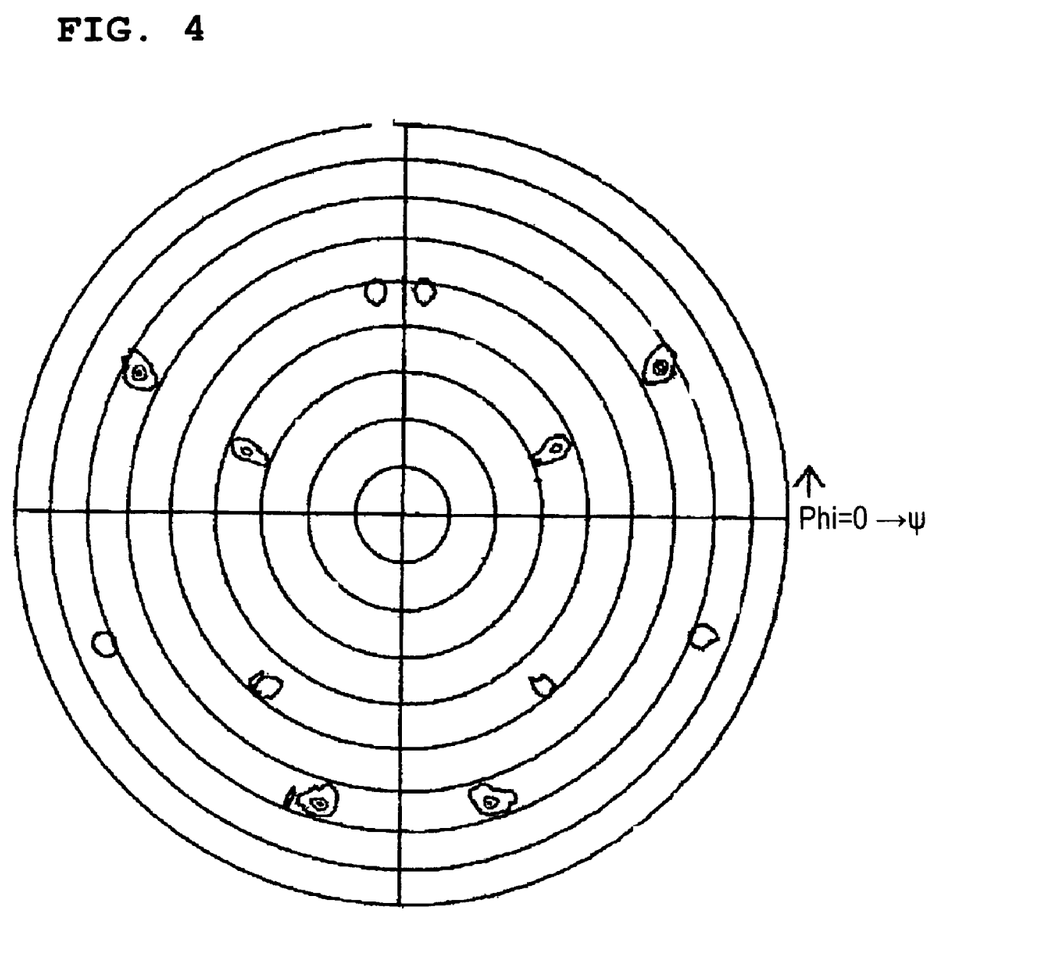
FIG. 4 is a view showing an X-ray diffraction pole figure of an Al electrode layer obtained in a second example according to preferred embodiments of the present invention.
Figure 5:
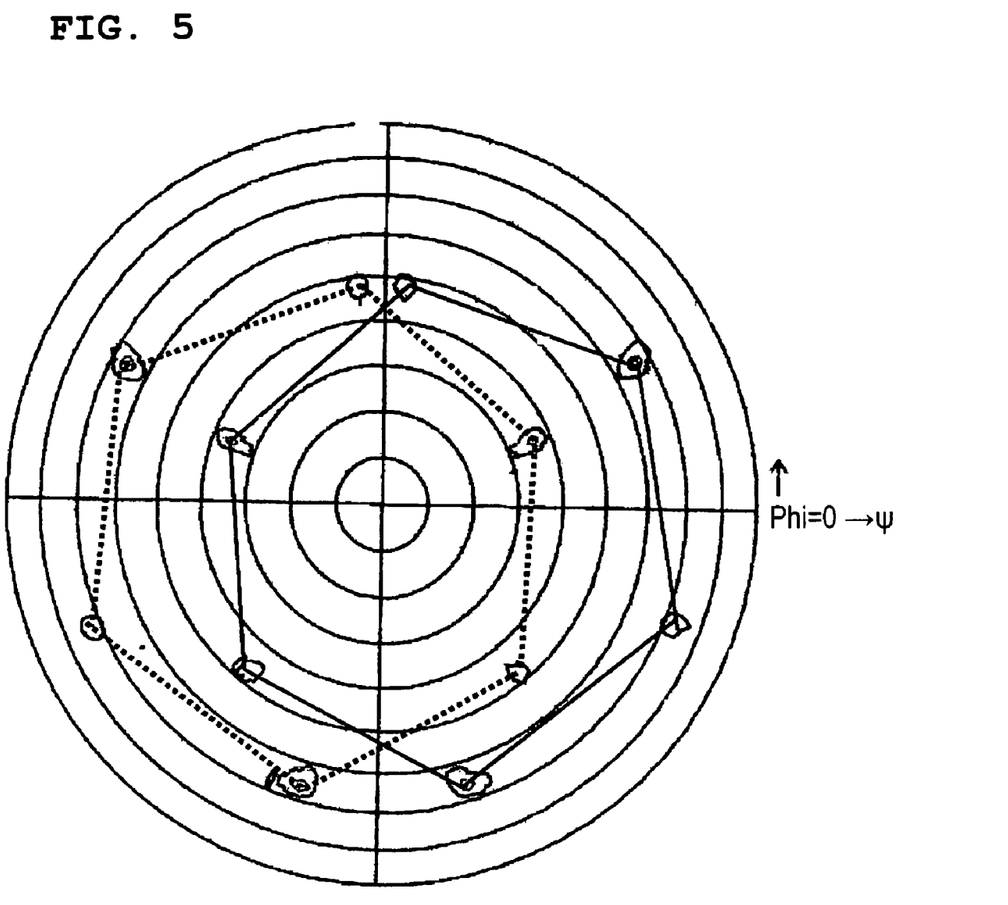
FIG. 5 is a view showing the X-ray diffraction pole shown in FIG. 4 provided with additional lines for illustrating the diffraction pattern.
Figure 6:
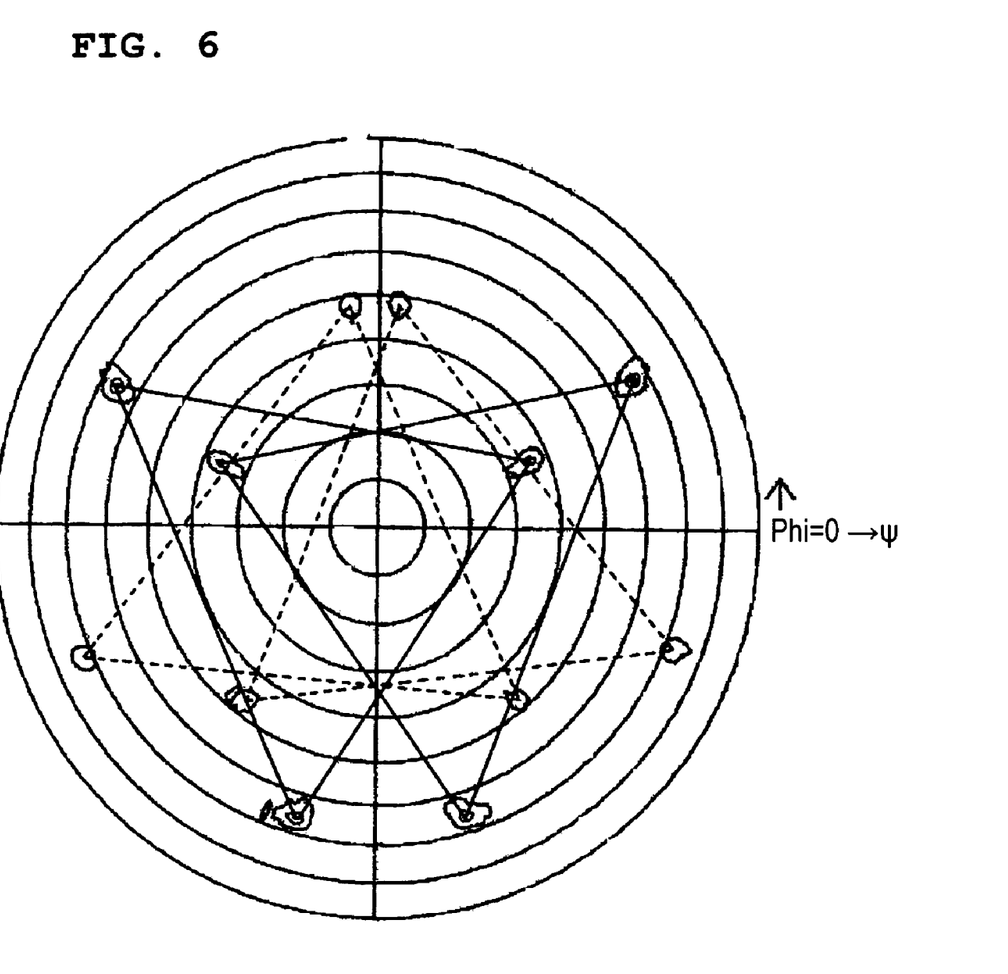
FIG. 6 is a view showing the X-ray diffraction pole shown in FIG. 4 provided with additional lines different from those in FIG. 5 for illustrating the diffraction pattern.

FIG. 4 shows an X-ray diffraction pole figure obtained in this second example in which X-rays were incident on the (200) plane of the Al electrode layer 4. As shown in FIGS. 5 and 6, additional lines were drawn for illustrating the diffraction pattern shown in FIG. 4.

As shown in FIGS. 4, 5, and 6, the Al electrode layer 4 was a thin epitaxial film in which diffraction spots having a plurality of symmetry centers were observed. Twelve spots in FIGS. 4, 5 and 6 show the detection of reflection signals from the (200) plane of the Al.

As can be apparently seen in FIG. 5, the twelve diffraction spots thus detected were two sets of six-fold symmetry spots. As in the first example, the angular distance between each spot and the corresponding symmetry center in the ψ direction was approximately 55°, and each symmetric center approximately coincided with the [111] direction of Al. In addition, the symmetry center and the normal line (the center of the pole figure) of the piezoelectric substrate 2 were spaced apart from each other by approximately ±10 to 20° in the ψ direction.

In the pole figure in the case of X-rays being incident on the (200) plane of the Al, the fact that the six-fold symmetry spots were observed means that a triaxial orientation film was formed in which the Al[111]-oriented film was grown in the direction toward the symmetry center.

In addition, the six-fold symmetry spots themselves mean the formation of a twin. The reason for this is that when X-rays are incident on the Al(200) plane, the diffraction spots from the Al(111) single crystal are detected as the three-fold symmetry spots each located at a position apart from the symmetry center by approximately 55°. In more particular, there are three symmetry spots, i.e., (100), (010), and (001). That is, the six-fold symmetry spots are formed of two sets of three-fold symmetry spots, as shown in FIG. 6, and these two sets of the three-fold symmetry spots have the positional relationship with each other in which one set is located at a position that is rotated by 180° from that of the other set.

As described above, in the second example, since the two sets of the six-fold symmetry spots having the twin structure were present as shown in FIG. 5, this Al electrode layer 4 can also be regarded as "a twin formed of two twins" (four single domains are present). That is, when it is assumed that the two sets of the three-fold symmetry spots shown in FIG. 2 each indicate a twin, the film structure described above may be easily understood.

Although the very complicated diffraction spots are shown in FIG. 4, the Al electrode layer 4 obtained in the second example is also a triaxial epitaxial film formed of the Al(111) oriented in two growing directions and is essentially the same as that in the first example.

Next, the electrode 3 was formed into an interdigital shape using a photolithographic technique and a dry etching technique, thereby forming a surface acoustic wave filter as the surface acoustic wave device 1. In addition, a surface acoustic wave filter having an Al electrode layer, which was a uniaxial orientation film, was also formed as a comparative example in which the Al(111) plane grew perpendicular to the piezoelectric substrate 2. When the surface acoustic wave filters thus formed were compared to each other, the electrical power resistance of the surface acoustic wave filter formed in the second example was 1,000 times or more that of the comparative example. That is, concerning the electrical power resistance, it was understood that the advantage in the second example is equivalent to that in the first example.

THIRD EXAMPLE

In a third example, a surface acoustic wave filter was formed having the structure shown in FIG. 1 as the surface acoustic wave device 1.

First, a piezoelectric substrate 2 composed of a 36° Y-cut LiTaO$_3$ single crystal was prepared.

Subsequently, on the piezoelectric substrate 2, the underlying electrode layer 5 was formed by an electron beam deposition method using Ti at a temperature of about 70° C. so as to have a thickness of about 20 nm, and was then cooled to a temperature of about 50° C. or less in an evacuated state.

After the cooling described above, the Al electrode layer 4 was formed using Al so as to have a thickness of about 100 nm.

The Al electrode layer 4 thus formed had a half value width of the Al(111) of approximately 2° measured by X-ray diffraction. As a comparative example, when the underlying electrode layer 5 and the Al electrode layer 4 were formed without heating as described above, the half value width of the Al(111) thereof was approximately 5°. According to the third example described above, it was confirmed that significantly higher orientation can be obtained.

Next, the electrode 3 was formed into an interdigital shape using a photolithographic technique and a dry etching technique, thereby forming the surface acoustic wave filter defining the surface acoustic wave device 1.

When the electrical power resistances of the surface acoustic wave filter of the third example and that of the comparative example were compared to each other by applying a constant electrical power, a service life of that in the third example was much longer than that in the comparative example.

FOURTH EXAMPLE

Figure 8:
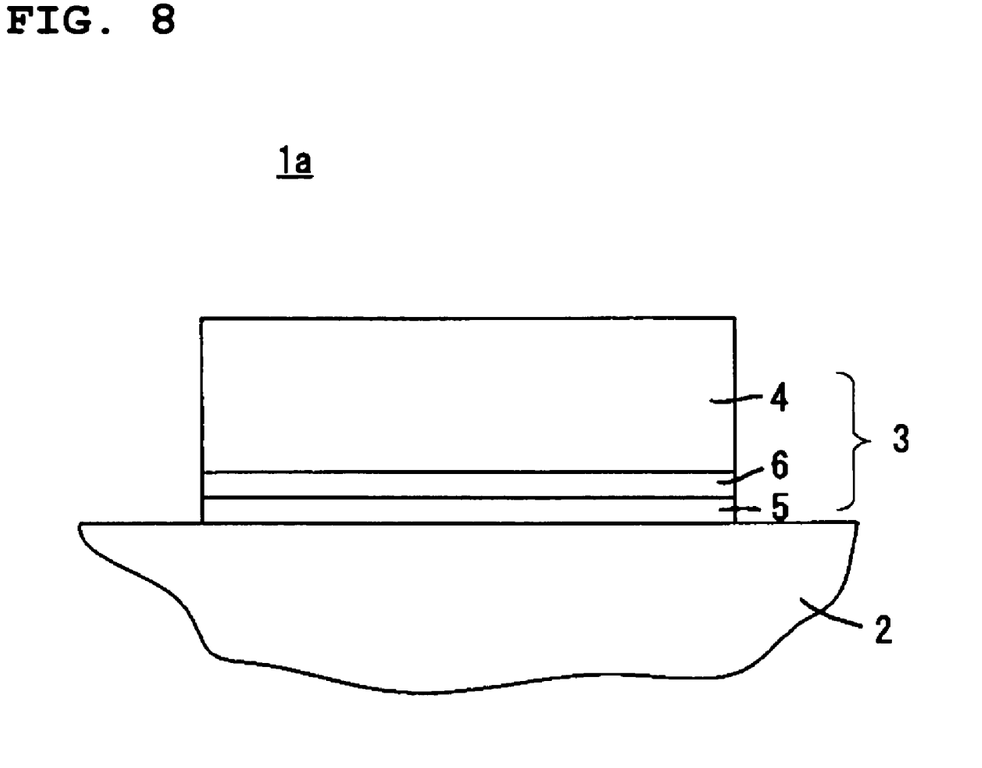
FIG. 8 is a partly cross-sectional view of a surface acoustic wave device formed by a manufacturing method of another preferred embodiment according to the present invention.

In a fourth example, a surface acoustic wave filter was formed as a surface acoustic wave device 1a having the structure shown in FIG. 8.

First, a piezoelectric substrate 2 composed of a 36° Y-cut LiTaO$_3$ single crystal was prepared.

Subsequently, on the piezoelectric substrate 2, the underlying electrode layer 5 was formed by an electron beam deposition method using Ti at a temperature of about 70° C. so as to have a thickness of about 10 nm, and was then cooled to a temperature of about 50° C. or less in an evacuated state.

After the cooling described above, an intermediate electrode layer 6 composed of Ti, which was the same material as that for the underlying electrode layer 5, was formed at a temperature of about 50° or less so as to have a thickness of about 10 nm.

The Al electrode layer 4 was then formed using Al so as to have a thickness of about 100 nm.

The Al electrode layer 4 thus formed had a half value width of the Al(111) of approximately 1.8° measured by X-ray diffraction. According to the fourth example, it was confirmed that a layer having significantly high orientation can be obtained as compared to those obtained in the comparative example and the third example.

Next, the electrode 3 was formed into an interdigital shape using a photolithographic technique and a dry etching technique, thereby forming the surface acoustic wave filter as the surface acoustic wave device 1a.

When the electrical power resistances of this surface acoustic wave filter of the fourth example was compared with those of the comparative example and the third example by applying a constant electrical power, a service life of the filter in the fourth example was much longer as compared to the other filters described above.

FIFTH EXAMPLE

In a fifth example, a surface acoustic wave filter was formed as the surface acoustic wave device 1a having the structure shown in FIG. 8.

First, a piezoelectric substrate 2 composed of a 36° Y-cut LiTaO$_3$ single crystal was prepared and was then processed by pretreatment using a buffered hydrogen fluoride (BHF) solution at room temperature for ten minutes, thereby removing a deteriorated layer which was present on the surface of the piezoelectric substrate 2 and inhibited epitaxial growth.

Subsequently, the underlying electrode layer 5 was formed by an electron beam deposition method using Ti at a temperature of about 180° C. so as to have a thickness of about 10 nm and was then cooled to room temperature in an evacuated state.

After the cooling described above, the intermediate electrode layer 6 composed of Ti, which was the same material as that for the underlying electrode layer 5, was formed so as to have a thickness of about 10 nm.

The Al electrode layer 4 was then formed using Al so as to have a thickness of about 100 nm.

X-ray diffraction analysis was performed for the Al electrode layer 4 thus formed. The result obtained was equivalent to that shown in the X-ray diffraction pole figure obtained in the first example.

That is, as shown in FIG. 3, the Al electrode layer 4 was a thin epitaxial film in which six diffraction spots were observed in the X-ray diffraction pole figure obtained when X-rays were incident on the Al(200) plane. Since reflection signals from the Al(200) plane were detected as the two sets of the three-fold symmetry spots, it was confirmed that the film forming the Al electrode layer 4 is a triaxial orientation film and is also a polycrystalline film having a twin structure.

Next, the electrode 3 was formed into an interdigital shape using a photolithographic technique and a dry etching technique, thereby forming the surface acoustic wave filter defining the surface acoustic wave device 1a.

As a comparative example for the fifth example, when a film was formed using Ti without heating in order to form the underlying electrode layer 5, an epitaxial film was not formed used as the Al electrode layer 4, and a uniaxial orientation film in which the Al(111) plane grew perpendicular to the piezoelectric substrate 2 was formed.

When the electrical power resistances of these surface acoustic wave filters thus obtained were compared to each other by applying a constant electrical power, a service life of the filter in the fifth example was 1,000 times or more than that of the comparative example.

SIXTH EXAMPLE

In a sixth example, a surface acoustic wave filter was formed as the surface acoustic wave device 1 a having the structure shown in FIG. 8.

First, a piezoelectric substrate 2 composed of a 42° Y-cut LiTaO$_3$ single crystal was prepared. Subsequently, by using a process equivalent to that in the third example, the underlying electrode layer 5, the intermediate electrode layer 6, and the Al electrode layer 4 were formed on the piezoelectric substrate 2 in that order.

X-ray diffraction analysis was performed for the Al electrode layer 4 thus formed. The result obtained was equivalent to that shown in the X-ray diffraction pole figure obtained in the second example.

As can be seen from FIG. 5, the twelve diffraction spots thus detected shown in FIG. 4 were two sets of six-fold symmetry spots. The angular distance between each symmetry spot and the corresponding symmetry center in the v direction was approximately 55°, and each symmetric center approximately coincided with the [111] direction of Al. In addition, the symmetry center and the normal line (the center of the pole figure) of the piezoelectric substrate 2 were spaced apart from each other by about ±10 to 20° in the ψ direction. In FIG. 5, the distance between the symmetry center and the center of pole figure was approximately 17° in the ψ direction. However, since this angle varies in accordance with conditions of the piezoelectric substrate 2, a film-forming temperature, or the like, in consideration of this variation, the distance can be considered to be in the range of about ±10 to 20° as described above.

In the pole figure in the case of X-rays being incident on the Al(200) plane, the fact that the six-fold symmetry spots were observed means that the [111] direction of Al was oriented so as to approximately coincide with the center of the symmetry center, that is, a triaxial orientation film was formed in which the Al[111]-oriented film was grown in the direction toward the symmetry center.

In addition, the six-fold symmetry spots in themselves mean the formation of a twin. The reason for this is that when X-rays are incident on the Al(200) plane, the diffraction spots from the Al(111) single crystal are detected as the three-fold symmetry spots each located at positions apart from the symmetry center by approximately 55°. More particularly, they are three symmetry spots, i.e., (100), (010), and (001). The fact that the two sets of the three-fold symmetry spots were observed means that the two centers of the symmetry spots were present, and that the Al[111]-oriented crystal had two growing directions. In other words, the [111]-oriented single-crystal Al grew in two orientation directions, that is, the twin structure was formed. As can be seen in FIG. 6, these two sets of the three-fold symmetry spots have a positional relationship with each other in which one set is located at a position rotated by 180° from that of the other set.

As described above, in the sixth example, since there were the two sets of the six-fold symmetry spots having the twin structure as shown in FIG. 5, this Al electrode layer 4 having this film structure can also be regarded as "a twin formed of two twins" (four single domains are present). That is, it may be assumed that the two sets of the three-fold symmetry spots shown in FIG. 3 each form a twin.

Although the very complicated diffraction spots are shown in FIG. 4, the Al electrode layer 4 obtained in the sixth example is also a triaxial orientation epitaxial film formed of the Al(111) oriented in two growing directions and is essentially the same as that in the second example.

Next, the electrode 3 was formed into an interdigital shape using a photolithographic technique and a dry etching technique, thereby forming the surface acoustic wave filter as the surface acoustic wave device 1. In addition, a surface acoustic wave filter having an Al electrode layer, which was a uniaxial orientation film, was also formed as a comparative example in which the Al(111) plane grew perpendicular to the piezoelectric substrate 2. When the surface acoustic wave filters thus formed were compared to each other, the electrical power resistance of the surface acoustic wave filter formed in the sixth example was 1,000 times or more than that of the comparative example.

In the first to the sixth examples described above, as the piezoelectric substrate 2, a 36+°Y-cut LiTaO$_3$ substrate and a 42° Y-cut LiTaO$_3$ substrate are preferably used. However, in addition to those examples of preferred embodiments described above, any substrate formed of a piezoelectric single crystal may be used. In particular, the cut angle of the Y-cut is preferably in the range of from 36° to 42°. In addition, as the piezoelectric single crystal material for the piezoelectric substrates, a single crystal formed of $LiTaO_3$ or $LiNbO_3$ is preferably used.

In addition, in the first to the sixth examples described above, as the material for the underlying electrode layer 5, Ti is preferably used. However, it has been confirmed that when another metal, such as Cr or an alloy primarily composed of Cr or Ti, having an effect of improving the crystallinity of the Al electrode layer 4 is used, the same advantage as described above can be obtained.

In the first to the sixth examples described above, when the underlying electrode layer 5 is formed, a film-forming temperature therefor is preferably set to about 180° C. However, the temperature is not limited thereto. It has been confirmed that when this film-forming temperature is changed, spot intensity of X-ray diffraction pole figure obtained when the X-rays are incident on the Al(200) plane varies as shown in FIG. 7.

Figure 7:
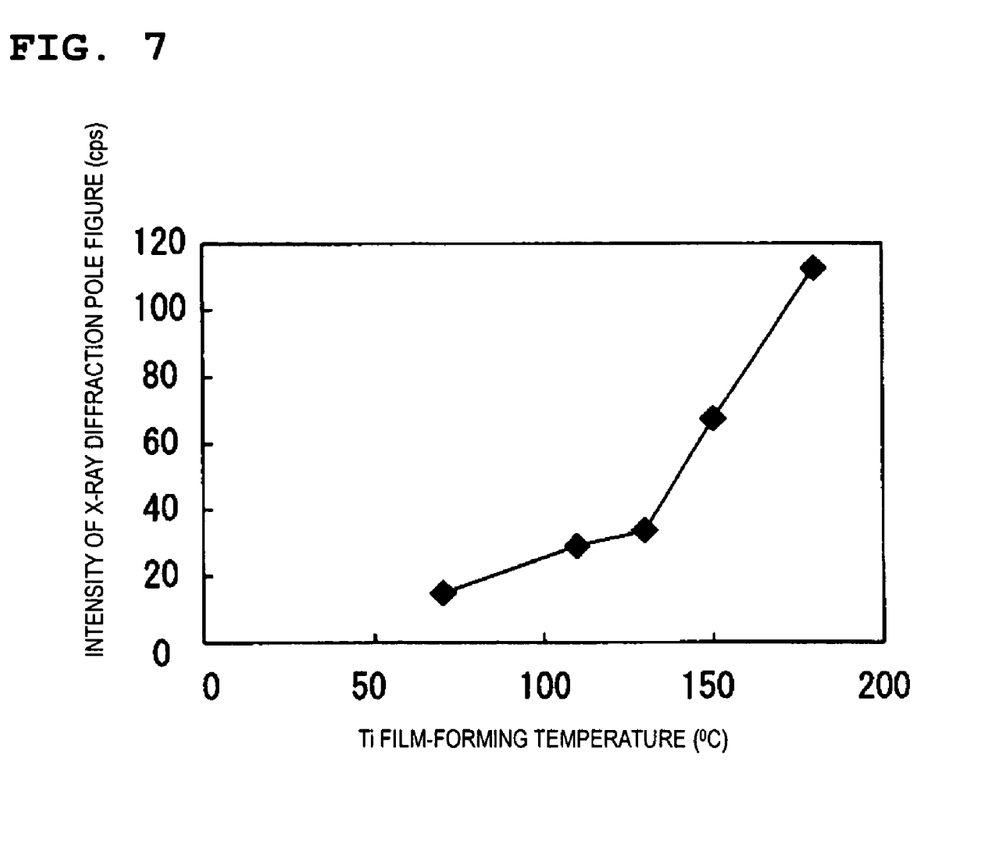
FIG. 7 is a view showing the relationship between the Ti film-forming temperature for forming an underlying electrode layer and spot intensity of an X-ray diffraction pole figure of an Al electrode layer when X-rays are incident on the Al(200)

As can be seen from FIG. 7, when the film-forming temperature for the underlying electrode layer 5 is about 70° C. or more, diffraction spots of the Al electrode layer 4 formed thereon are detected, and an epitaxial Al film having the twin structure can be formed. However, in order to obtain higher diffraction intensity, that is, to obtain an Al film having superior crystallinity, the Ti film-forming temperature for forming the underlying electrode layer 5 is preferably set to a higher temperature.

When the Ti film-forming temperature is excessively increased, due to pyroelectric properties, since the piezoelectric substrate 2 tends to be easily broken, the film-forming temperature is preferably about 300° C. or less in practice.

In addition, in preferred embodiments and the examples described above, the electrode layer is preferably primarily formed of Al. However, when a metal is used which has a face-centered cubic lattice and is primarily composed of platinum (Pt), gold (Au), Cu, or silver (Ag), the same advantages as those described above can be obtained.

As has thus been described, according to the surface acoustic wave device of preferred embodiments of the present invention, since the electrode layer, which defines the electrode provided on the piezoelectric substrate composed of a piezoelectric single crystal, is an orientation film formed by epitaxial growth and is also a polycrystalline thin film having a twin structure in which a diffraction pattern observed in an X-ray diffraction pole figure has a plurality of symmetry centers, the formation of hillocks and/or voids in the electrode is prevented, and in addition, the plastic deformation thereof is prevented from occurring, thereby improving the electrical power resistance of the surface acoustic wave device.

As the material for the electrode layer described above, when Al having low resistance and a low specific gravity is used, superior filter properties can be obtained.

In the surface acoustic wave device described above, when the underlying electrode layer primarily composed, for example, of at least one of Ti and Cr is provided between the electrode layer and the piezoelectric substrate, the crystallinity of the electrode layer can be further improved.

According to preferred embodiments of the present invention, the method for manufacturing a surface acoustic wave device further includes a step of forming the intermediate electrode layer on the underlying electrode layer at a low temperature of 50° C. or less in order to place a crystal face present on the surface of the underlying electrode layer in a cleaner state, and the Al electrode layer is formed on this intermediate electrode layer. Hence, even when the underlying electrode layer is provided with an oxide layer thereon since being formed at an elevated temperature, a cleaner crystal face for forming the Al electrode layer can be obtained by the presence of the intermediate electrode layer while high orientation properties are maintained, thereby further improving the crystallinity of the Al electrode layer.

According to preferred embodiments of the present invention, when a $LiNbO_3$ or a $LiTaO_3$ single crystal is used for the piezoelectric substrate, the piezoelectric property can be improved, and when the surface acoustic wave device constitutes a filter or other device, the usable bandwidth therefor can be increased.

In addition, as the piezoelectric substrate, when a $\theta$ rotation Y-cut ($\theta=36°$ to 42°) $LiTaO_3$ substrate is used, an electrode layer having the particular crystal structure described above can be reliably and easily formed.

According to the method of preferred embodiments of the present invention for manufacturing a surface acoustic wave device, prior to the step of forming the underlying electrode layer, the step for performing the etching treatment for the piezoelectric substrate is performed to expose a crystal face on the surface thereof so that the Al electrode layer can be grown by epitaxial growth. Hence, when the underlying electrode layer is formed on the surface of the piezoelectric substrate followed by the formation of the Al electrode layer, information on crystal alignment, which is necessary for epitaxial growth, can be securely transmitted to the Al electrode layer.

In addition, according to the method of preferred embodiments of the present invention for forming a surface acoustic wave device, when the electrode is formed which includes the Al electrode layer primarily composed of Al and the underlying electrode layer provided between the Al electrode layer and the piezoelectric substrate for improving the crystallinity of the Al electrode layer, the underlying electrode layer is formed by heating to a temperature of about 70° C. or more, and subsequently, the Al electrode layer is formed at a low temperature of about 50° C. or less.

Accordingly, since energy required for crystal growth of the underlying electrode layer is supplied by heating, an underlying electrode layer having high orientation is obtained. Hence, the crystallinity of the Al electrode layer formed on this underlying electrode layer is greatly improved, the stress migration resistance of the electrode is greatly improved, and the electrical power resistance of the surface acoustic wave device thus formed is greatly improved.

In addition, when the Al electrode layer is formed, since film formation at a low temperature of about 50° C. or less is performed, the counter diffusion between the Al and a material included in the underlying electrode layer can be avoided, and hence degradation of the Al electrode layer caused by this counter diffusion can be prevented.

In the step of forming the underlying electrode layer by heating, when a temperature of about 300° C. or less is used, breakage of the piezoelectric substrate caused by pyroelectric properties can be securely prevented.

In addition, in the step of forming the Al electrode layer at a low temperature, when a temperature of about 0° C. or more is used, a specific cooling apparatus is not necessary, and hence increase in cost thereby can be avoided.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A method for manufacturing a surface acoustic wave device including a piezoelectric substrate formed of a Y-cut piezoelectric single crystal, and at least one electrode formed on the piezoelectric substrate, the electrode including an Al electrode layer primarily composed of Al and an underlying electrode layer provided between the piezoelectric substrate and the Al electrode layer for improving the crystallinity thereof, the Al electrode layer being an oriented film formed by epitaxial growth and being a polycrystalline thin film having a twin structure in which a diffraction pattern observed in an X-ray diffraction pole figure has a plurality of symmetry centers, the method comprising steps of:

preparing the piezoelectric substrate;
forming the underlying electrode layer on a surface the piezoelectric substrate;
forming the Al electrode layer on the underlying electrode layer; and
prior to forming the underlying electrode layer, performing an etching treatment for the piezoelectric substrate to expose a crystal face on the surface of the piezoelectric substrate so that the Al electrode layer is to be formed by epitaxial growth; wherein
the underlying electrode layer is made of a non-piezoelectric material.

2. A method for manufacturing a surface acoustic wave device according to claim 1, wherein the step of performing etching treatment is performed using an etchant containing at least one selected from the group consisting of phosphoric acid, pyrophosphoric acid, benzoic acid, octanoic acid, hydrochloric acid, nitric acid, sulfuric acid, hydrofluoric acid, buffered hydrofluoric acid (BHF), and potassium hydrogen sulfate.

3. A method for manufacturing a surface acoustic wave device including a piezoelectric substrate, and at least one electrode formed on the piezoelectric substrate, the electrode including an Al electrode layer primarily composed of Al and an underlying electrode layer provided between the piezoelectric substrate and the Al electrode layer for improving the crystallinity thereof, the method comprising steps of:

preparing the piezoelectric substrate;
forming the underlying electrode layer on the piezoelectric substrate by heating to a temperature of about 70° C. or more; and
forming the Al electrode layer at a temperature of about 50° C. or less.

4. A method for manufacturing a surface acoustic wave device according to claim 3, wherein the step of forming the underlying electrode layer is performed at a temperature of about 300° C. or less.

5. A method for manufacturing a surface acoustic wave device according to claim 3, wherein the step of forming the Al electrode layer is performed at a temperature of about 0° C. or more.

6. A method for manufacturing a surface acoustic wave device according to claim 3, wherein the piezoelectric substrate includes a Y-cut piezoelectric single crystal.

7. A method for manufacturing a surface acoustic wave device according to claim 6, wherein the piezoelectric substrate comprises one of a $LiNbO_3$ and a $LiTaO_3$ single crystal.

8. A method for manufacturing a surface acoustic wave device according to claim 7, wherein the piezoelectric substrate is a θ rotation Y-cut $LiTaO_3$ substrate in which θ is in the range of from about 36° to about 42°.

9. A method for manufacturing a surface acoustic wave device according to claim 3, wherein the Al electrode layer is grown so as to form an epitaxial film having a twin structure in the step of forming the Al electrode layer.

10. A method for manufacturing a surface acoustic wave device according to claim 9, further comprising, prior to the step of forming the underlying electrode layer, a step of performing pretreatment for the piezoelectric substrate to expose a crystal face on a surface thereof so that the Al electrode layer is to be formed by epitaxial growth.

11. A method for manufacturing a surface acoustic wave device according to claim 3, wherein the underlying electrode layer includes at least one of Ti and Cr as a primary component.

12. A method for manufacturing a surface acoustic wave device according to claim 3, further comprising a step of forming an intermediate electrode layer on the underlying electrode layer at a temperature of about 50° C. or less for placing a crystal face present on the underlying electrode layer in a cleaner state, wherein the Al electrode layer is formed on the intermediate electrode layer in the step of forming the Al electrode layer.

13. A method for manufacturing a surface acoustic wave device according to claim 12, wherein the intermediate electrode layer includes at least one of Ti and Cr as a primary component.

14. A method for manufacturing a surface acoustic wave device according to claim 12, wherein the intermediate electrode layer is made of the same material as that used to form the underlying electrode layer.

15. A method for manufacturing a surface acoustic wave device according to claim 12, wherein the step of forming the intermediate electrode layer is performed at a temperature of about 0° C. or more.

* * * * *